United States Patent
Parthier et al.

(10) Patent No.: US 6,932,864 B2
(45) Date of Patent: Aug. 23, 2005

(54) METHOD AND APPARATUS FOR MEASURING THE POSITION OF A PHASE INTERFACE DURING CRYSTAL GROWTH

(75) Inventors: Lutz Parthier, Berlin (DE); Frank-Thomas Lentes, Bingen (DE); Gunther Wehrhan, Jena (DE); Burkhard Speit, Jena (DE); Hans-Joerg Axmann, Jena (DE)

(73) Assignee: Schott Glas, Mainz (DE)

( * ) Notice: Subject to any disclaimer, the term of this patent is extended or adjusted under 35 U.S.C. 154(b) by 0 days.

(21) Appl. No.: 10/128,856

(22) Filed: Apr. 23, 2002

(65) Prior Publication Data

US 2002/0157599 A1 Oct. 31, 2002

(30) Foreign Application Priority Data

Apr. 27, 2001 (DE) .......................... 101 20 730

(51) Int. Cl.$^7$ .................. C30B 15/20; C30B 19/10; C30B 11/00
(52) U.S. Cl. ..................... 117/14; 117/38; 117/55
(58) Field of Search ................ 117/14, 15, 38, 117/39, 55

(56) References Cited

U.S. PATENT DOCUMENTS

| | | | | |
|---|---|---|---|---|
| 3,740,563 A | * | 6/1973 | Reichard ............... | 250/217 R |
| 4,155,779 A | * | 5/1979 | Auston et al. ............ | 148/1.5 |
| 4,318,769 A | * | 3/1982 | Sachs ..................... | 156/601 |
| 4,350,557 A | * | 9/1982 | Scholl et al. ............. | 156/601 |
| 4,508,970 A | * | 4/1985 | Ackerman ................ | 250/577 |
| 4,710,258 A | * | 12/1987 | Latka ..................... | 156/601 |
| 4,926,357 A | * | 5/1990 | Katsuoka et al. .......... | 364/560 |
| 5,292,486 A | * | 3/1994 | Drechsel .................. | 422/249 |
| 6,071,340 A | | 6/2000 | Li | |
| 6,103,401 A | * | 8/2000 | Okada et al. ............. | 428/634 |
| 6,341,173 B2 | * | 1/2002 | Altekruger et al. ........ | 382/141 |

FOREIGN PATENT DOCUMENTS

| | | |
|---|---|---|
| DE | 23 37 169 A1 | 11/1974 |
| DE | 39 04 858 A1 | 9/1989 |
| DE | 198 06 446 A1 | 8/1999 |

OTHER PUBLICATIONS

Patent Abstracts of Japan 06–305877, Nov. 1, 1994.
Patent Abstracts of Japan 62–192641, Aug. 24, 1987.
"Kristallzuechtung" by K. Wilke und J. Bohm, P. 595.
"Artificial Fluorite" by Donalf C. Stocknarger, J. Optical Soc. Amer. 39 (1949), pp. 731–740.

* cited by examiner

Primary Examiner—Benjamin L. Utech
Assistant Examiner—Matthew Anderson
(74) Attorney, Agent, or Firm—Michael J. Striker

(57) ABSTRACT

In the method and apparatus for measuring the position of the phase interface during growth of a crystal from a melt in a crystal growth container according to the VGF method an incident optical signal is propagated to the phase interface between the melt and the crystal through a window (16) in the container (10) and a received optical signal reflected from the phase interface (14) is measured to determine the position of the phase interface. The position of the phase interface is established from the reflected signal by triangulation with a confocal optic system, by interferometric balancing or by transit time of the optical signal. The window (16) is preferably mounted in a preferably tilted orientation at the end of a tube (15), which is immersed in the melt (12).

18 Claims, 3 Drawing Sheets

METHOD AND APPARATUS FOR MEASURING THE POSITION OF A PHASE INTERFACE DURING CRYSTAL GROWTH

BACKGROUND OF THE INVENTION

1. Field of the Invention

The present invention relates to a method and apparatus for measuring the position of a phase interface or boundary during crystal growth.

2. Description of the Related Art

The measurement of the position of a phase interface between liquid and solid that grows upward during crystal growth in a container or the like, which means the measurement of the actual crystal height is of considerable significance for the crystal growth process. Control of the crystal growth process is only possible when the position of the phase interface is measured.

Crystal growth according to the VGF method is usually performed in a closed container under vacuum, inert gas or reactive gas.

Access to the crystal growth chamber in the container is not possible without additional special features, especially with high melting materials and/or with materials that have a high vapor pressure. When a window is built into a container there are always various problems. Furthermore optical windows are generally rapidly fogged or coated, so that no, or no reproducible, measurement of the position of the interface is possible.

Several possible methods are described in the literature however for determination of the position or height of a phase interface:

1. Indirect Methods: Doping elements may be built into crystals with predetermined temperature discontinuities or jumps. The temperature dependence and/or growth rate of the segregation or partition coefficient are used for this purpose. The distribution of the doping elements is then tested or checked in the finished crystal. Since these methods are indirect, they cannot be employed for process control.

2. Ultrasonic Methods (e.g. K. Wilke, J. Bohm in "Crystal Growth", p. 595). The speed of sound in the crystal can be employed for determination of the location of the phase interface. Transmitter and receiver are mounted outside of the crystal growth container, e.g. a graphite vessel. Complete contact must occur at the interface between all materials along the path of the sound wave from the transmitter to the receiver. However gaps may arise in the path between the growth vessel or container and the crystal due to small differences in the thermal expansion coefficients. These differences however can lead to great measurement errors. Because of the strong temperature dependence of the sound propagation speed additional errors arise. Since the temperature and the temperature gradient change continuously during crystal growth, no accurate calibration of the measurement signal is possible. Furthermore the ultrasonic waves, which are indeed mechanical shock waves, can produce imperfections or interference with the growing crystal front.

3. Mechanical Detection of Crystal Height (see D. C. Stockbarger, "Artificial Fluorite", J. Optical Soc. Amer. 39, pp.731 to 741 (1949)). The height of the crystals in the growth vessel or container is measured at arbitrary intervals with a detection rod or bar made e.g. of tungsten or graphite.

The mechanical motion of the detection bar or rod can however lead to temperature non-uniformities in the melt and to production of undesirable convection in the melt. The contact of the tip or end of the detection bar or rod can produce a mechanical stress in the crystal as a result, which makes the contacted region of the crystal unsuitable for further use. Also subsequent temperature processing cannot eliminate this sort of defect in the crystal.

SUMMARY OF THE INVENTION

It is an object of the present invention to provide a method and apparatus for measuring the position of a phase interface during crystal growth, which permits the measurement of the position of the phase interface, in order to measure crystal growth speed as a prerequisite for control of the crystal growth process.

According to the invention the method for measuring the position of the phase interface between the melt and the growing crystal during crystal growth comprises propagating an incident optical signal toward the phase interface between the melt and the crystal and measuring the location or portion of the phase interface with the aid of a reflected optical signal formed at the phase interface from the incident optical signal.

The apparatus for measuring the position of the growing phase interface during crystal growth according to the invention includes means for propagating an incident optical signal toward the phase interface between the melt and the growing crystal and means for determining the position or location of the phase interface from the resulting reflected optical signal from the phase boundary. The means for determining the position or location of the phase interface can comprise means for triangulation with a confocal lens structure or optical system, means for interferometric balancing or adjusting or means for measuring optical signal transit time.

The process and apparatus according to the invention are especially suitable for measuring the crystal height in the crystal growth vessel or container.

The determination of the position of the phase boundary or the measurement of the crystal height occurs according to the invention without contact with the crystal by means of optical methods. The reflection and, if necessary, the phase shift of an optical signal at the phase interface between liquid and solid (melt and crystal) thus establishes the position or height of this boundary surface (the phase boundary) in the crystal growth vessel.

The position of the phase interface can be established by triangulation with a confocal lens or optic structure, by means of interferometric balancing or adjusting or with the aid of the transit time of an optical signal.

Preferably the optical window required for input of the optical signal is mounted in a hollow rod, a tube or a pipe made e.g. from tungsten or graphite, which is immersed or dipped a few millimeters into the upper region of the melt. The optical beam of the reflected and incident signal is preferably vertical. This arrangement is especially advantageous, when the reflection of the optical signal on the surface of the melt is very large.

Alternatively the window can be mounted at the warmest position of the vessel, at which no fogging or vapor deposition on the window surface occurs. A third possibility is that the window is located in the vicinity of the seed crystal so that measurement of the already growing crystal occurs.

Silicon carbide and diamond can be used as window materials, which must be high-temperature or heat resistant. Both materials have a large spectral transmission range, a high transmittance and a high chemical resistance to a chemically reactive environment. The large spectral transmission range permits optimal adjustment of the wavelength range employed to the absorption behavior of the crystalline substance to be measured.

It is important that the material used for the window is a single crystal material.

Alternatively the window can also be a DLC-coated material (DLC=diamond-like carbon).

When the material for the crystal is $CaF_2$, it is advantageous to use a silicon carbide or diamond window mounted in a graphic tube, because these materials are not wet by liquid calcium fluoride. When the measuring process halts they can be removed from the crystal without further effort.

When the incident beam is preferably vertical, subsequent adjustments because of changing incident and reflection angles and re-focussing due to wandering of the phase interface are not required.

An adjustment of the position or height of the phase interface can occur by a direct transit time measurement for the measurement signal. In order to obtain a resolution of e.g. 0.1 mm, a laser pulse in the femtosecond range must be used.

The measurement can however occur also by phase shift of the measurement signal. A commercial He—Ne laser with a 10 mW power output can be used as the light source.

The coupling in and out of the laser signal can occur by means of a light guide cable, which is arranged with suitable optics in the vicinity of the water-cooled container or vessel wall.

The method according to the invention and the apparatus according to the invention operate in a contactless and temperature independent manner. This permits continuous measurement and leads to no damage of the crystal lattice of the growing crystal. The measured signal can be used to directly control the process.

The method according to the invention is especially suitable for growing crystals according to the VGF method (VGF=Vertical Gradient Freeze).

An additional advantage of the method of the invention is that the existing apparatus for crystal growth does not need to be rebuilt. The pipe with the window, which is dipped in the melt, can be used in the already existing guide for a contacting rod. This existing guide is usually constructed so that it is gas-tight in order to be able to maintain the required vacuum or inert gas atmosphere in the crystal growth container.

BRIEF DESCRIPTION OF THE SEVERAL VIEWS OF THE DRAWING

The objects, features and advantages of the invention will now be illustrated in more detail with the aid of the following description of the preferred embodiments, with reference to the accompanying figures in which.

DETAILED DESCRIPTION OF THE INVENTION

The physical basis for the optical distance or position measurement systems is briefly explained here by means of examples.

The reflection coefficient (ratio of incident to reflected light) for the vertical beam (incident perpendicularly) on the phase interface between two optical media with the indices of refraction $n_1$ and $n_2$ is given by the Fresnel formula (1):

$$R=\{(n_2-n_1)/(n_1+n_2)\}^2. \qquad (1)$$

In the first approximation the indices of refraction of the solid and liquid phases of a material differ only because of differences in density. According to the Law of Clausius-Mosotti the index of refraction $n_S$ of a melt with a density $\rho_S$ can be estimated from the index of refraction $n_F$ of the crystal with a density of $\rho_F$ and close to but under the melting point:

$$(n_S^2-1)/(n_F^2-1)=\rho_S/\rho_F+\ldots \qquad (2)$$

Thus the index of refraction $n_F$ is estimated from (2) as:

$$n_S=\{1+(\rho_S/\rho_F)\cdot(n_F^2-1)\}^{1/2} \qquad (3)$$

When the material for the crystal is $CaF_2$, the density of the melt, $\rho_S=2.53$ g/cm$^3$, and the melt temperature $T_s$ is about 1380° C. The density of the solid crystal in the vicinity of the melt temperature is approximately the density at 20° C. ($\rho_{F,\ 20°\ C.}=3.18$ g/cm$^3$) and the cubic thermal expansion coefficient $\beta=60\times10^{-6}$/K. The index of refraction of the solid $CaF_2$ can be determined in the same way.

Since the index of refraction $n_{F,\ 632\ nm}$ of solid $CaF_2$ at 20° C. and at a wavelength of 632 nm is 1.433, the estimated value for the index of refraction $n_{F,\ 632\ nm}$ of solid $CaF_2$ at 20° C.

$$n_{F,\ 632\ nm,\ 1360°\ C.}=1.423$$

and for the index of refraction of the melted $CaF_2$ $$n_{S,\ 632\ nm}=1.356.$$

Using these values for the indices of refraction, the reflection coefficient R at the phase interface between the melt and the solid crystal amount to:

$$R_{Phg,\ 632\ nm}=5.8\times10^{-4}=0.058\%.$$

In contrast, the reflection coefficient from the melt to vacuum amounts to:

$$R_{Vak,\ 632\ nm}=2.3\%.$$

The optical reflection at this latter phase boundary is thus amount 40 times greater than that for the phase interface between the melt and the crystal.

The upper surface reflectance from the melt must thus be largely suppressed. Also inevitable defects present at the liquid surface hinder optical transmittance or produce faulty measured signals.

In the method described and in the apparatus described here an optical window is used, which is attached to the front side of a hollow rod or tube and is immersed in the melt. The tube comprises a heat resistant material such as tungsten or graphite (like the melt vessel). In order to suppress reflections occurring at the window, the window is tilted relative to the optic axis at a predetermined angle. Also the inevitable gas bubbles produced in the melt do not collect at the window, but climb to the surface of the melt.

Figure 1:
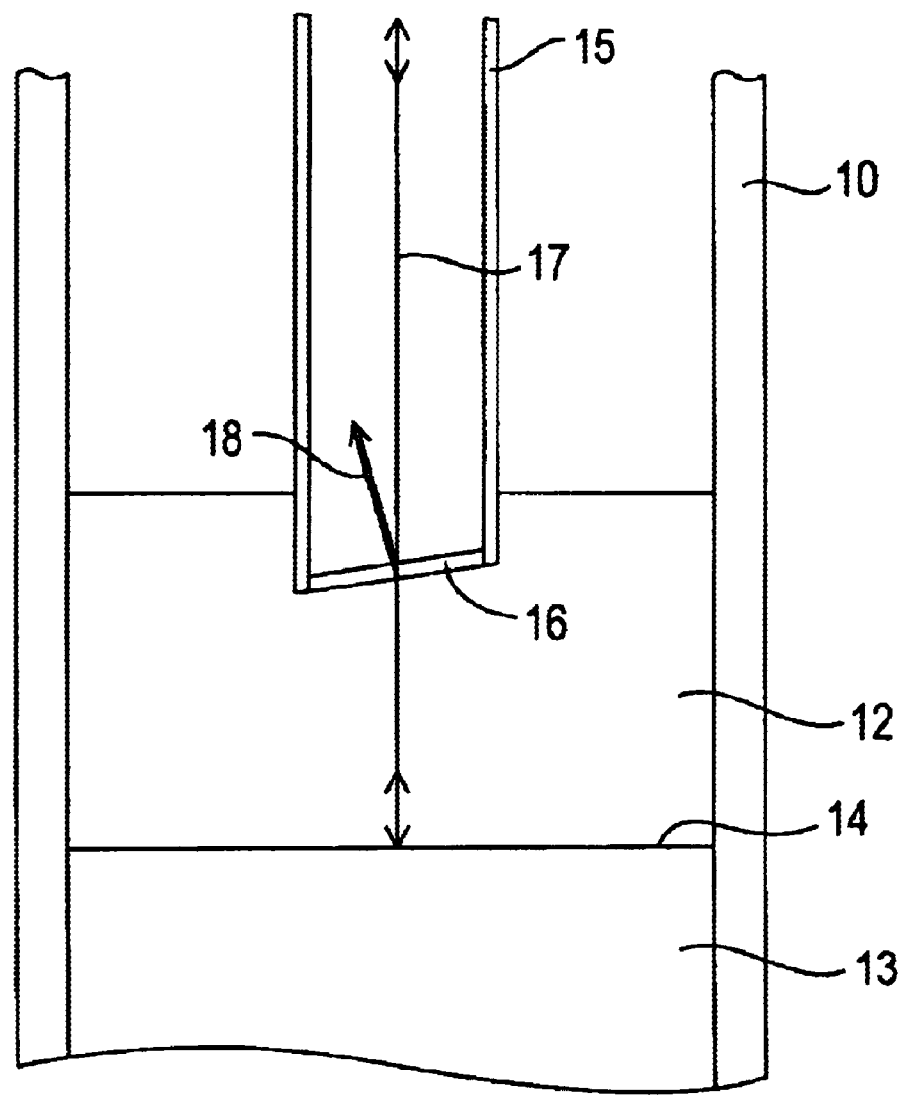
FIG. 1 is a longitudinal cross-sectional view through a vessel for growth of a crystal according to the VGF method with an optical window immersed in a melt.

This arrangement is shown in the cross-sectional view of FIG. 1. A melt 12, which has already partially solidified to form a crystal 13, is held in a graphite vessel 10 acting as growth container for the calcium fluoride crystal. A phase interface 14 has formed between the melt 12 and the crystal 13. A vacuum is located in the vessel above the melt 12 from which the crystal grows.

A graphite tube 15 is immersed a few millimeters in the melt 12. An optical window 16 made of silicon carbide or diamond is attached at the lower end of the tube 15. The window 16 and the tube 15 are connected flush with each other. The window 16 is inclined a few degrees relative to the optic axis 17, which is substantially coincident with the longitudinal axis of the tube 15 and vertical, which means that it extends perpendicular to the phase interface 14. The radiation 18 reflected at both plane parallel surfaces of the window 16 is thus not reflected back along the optic axis 17, but at an angle to it. Thus this back reflected radiation no longer influences the measurements.

Instead of silicon carbide or diamond the window 16 can be made from a DLC-coated material (DLC: diamond-like carbon).

Since the graphite vessel 10 serving as crystal growth container can have a temperature of more than 1500° C., provisions must be made so that the thermal radiation emitted by the vessel and the material in it do not interfere with the measurement signal. These provisions must be effective even for the certain portion of the thermal emission that propagates in the direction of the radiation reflected at the phase boundary in the tube 15.

The maximum radiation from a black body is at about 1.6 microns according to Wien's Law at a temperature of about 1500° C. The spectral energy distribution decreases exponentially at wavelengths, which are less than the wavelength at the radiation maximum according to Plank's Law for black body radiation. Thus the shortest possible wavelength and the smallest possible spectral bandwidth should be used for the measurement signal in order to obtain the highest possible signal to noise ratio between the reflected measurement signal and the background radiation of the vessel. A He—Ne laser with a wavelength of 0.632 microns or 632 nm is well suited as the radiation source. Also a narrow bandwidth spectral filter masks the black body radiation, which is outside the bandwidth of the measurement signal.

For measurement of a distance or spacing basically the linear amplification of light (triangulation, confocal distance measurement); the temporal coherence of the light beam (phase-measurement interferometry) or the transit time of a light beam or pulse can be called upon.

Figure 2:
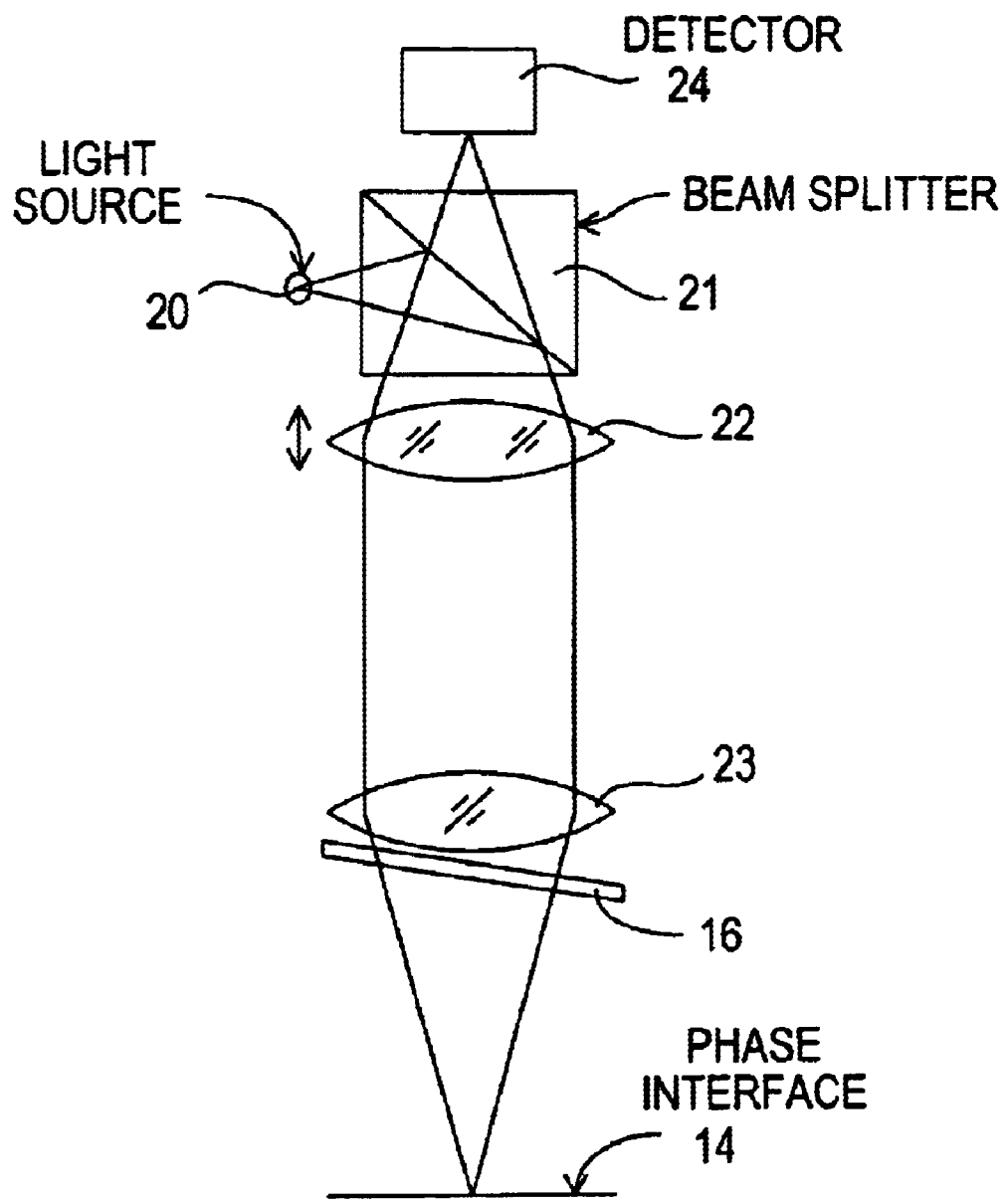
FIG. 2 is a diagrammatic longitudinal cross-sectional view through an apparatus for confocal distance measurement showing the main structural features of the apparatus.

In FIG. 2 a schematic diagram illustrating the distance measurement by triangulation with a confocal optic or laser structure is shown. The light from a light source 20 passes through a beam splitter 21 to a first lens system 22, which produces a parallel light beam. From there the parallel light beam passes through a second lens system 23 near the optical window 16 to the end of the tube 15. The light is focussed on the phase interface 14 from the second lens system 23.

Both lens systems 22, 23 can be integrated in the tube 15.

The light reflected at the phase interface 14 is propagated back along the same path and is deflected at the beam splitter 21 to a diaphragm or stop, behind which a suitable spectral filter and a sensor are located. In FIG. 2 a detector 24 comprising the diaphragm, spectral filter and sensor is shown.

When the light source 20, phase interface 14 and diaphragm are located in optically conjugate planes, the maximum signal is produced at the sensor in the detector 24. The motion of the phase interface 14 is compensated for by shifting the position of the first lens system 22, with which a confocal adjustment or balancing occurs. In other words, the position or shift of the phase interface 14 is detected by shifting the first lens system 22 for the confocal adjustment or balancing.

Figure 3:
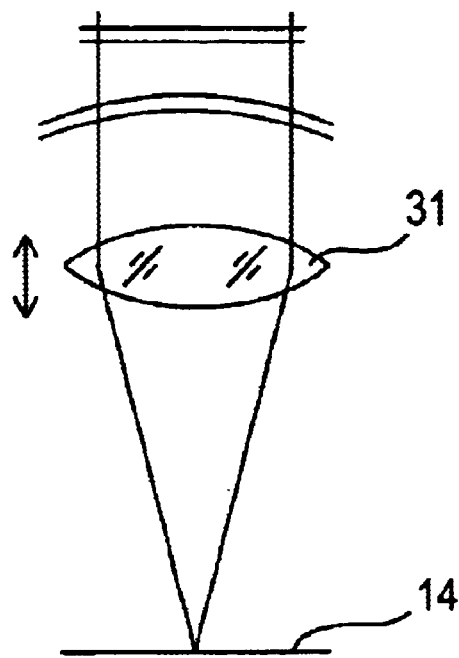
FIG. 3 is a sketch illustrating the principles of interferometric distance measurement.

FIG. 3 shows the principle of the interferometric position or distance measurement. In this method the interferometer also serves to establish the adjustment or balancing of the conjugate planes. During an incomplete balancing the wave front of the light beam reflected at the phase interface is curved because of the focus variation. The focussing error may be derived, for example by the representation (breaking down) of the reflected wave front into Zernike polynomials. Another possibility is based on the use of a Shack-Hartmann sensor. Also the planarity of the wave front or the curvature of the wave front is a measured as a measure of the confocal balancing or adjustment.

Figure 4:
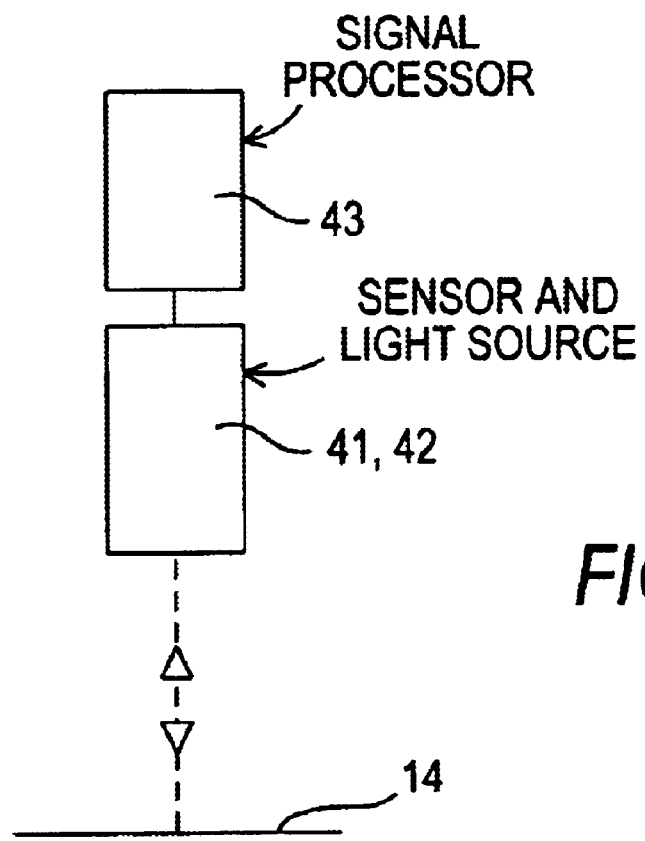
FIG. 4 is a sketch illustrating the principles of transit time distance measurement.

FIG. 4 shows a block diagram for an apparatus for measuring the distance to or the position of the phase interface in the transit time method. A short light pulse is propagated toward a target from a light source 41 toward the phase interface 14. The light reflected from the phase interface 14 is received in a sensor 42. The signal from the sensor 42 is processed in a signal processor 43. The distance of the light source 41 and the sensor 42 from the phase interface 14 and/or the height of the phase interface 14 may be accurately determined from the transit time of the light pulse and the very accurately known propagation speed of the light pulse.

A time resolution of $\Delta t = \Delta s/c \leq 0.3 \times 10^{-12}$ s is required for a desired measurement precision $\Delta s$ of 0.1 mm with the light speed $c = 2.997 \times 10^8$ m/s. Preferably the light of a laser is modulated with high frequency in the Ghz range. The phase of the signal reflected from the crystal phase interface 14 is compared electronically with the phase of the incident signal. Thus the phase shift at the phase interface is measured. The modulated high frequency can be preferably varied over a certain range. The distance to the phase interface or the position of the phase interface can be determined from the measured phase shift or phase positions of the signals depending on the modulation frequency.

A femtosecond pulsed laser can be used as the light source 41, for example. The very short pulse from this laser permits a direct transit time measurement for the optical signal.

The signal containing the information regarding the actual position or height of the phase interface 14 in the container 10 can be used directly as an actual value signal for controlling the crystallization process.

The disclosure in German Patent Application 101 20 730.1 of Apr. 27, 2001 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a method and apparatus for measuring location or distance to an interface between e.g. a liquid melt and a solid crystal, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of growing a crystal from a melt, said method comprising the steps of:
   a) providing a crystal growth container for containing the melt and the crystal grown from the melt;
   b) growing the crystal from the melt in the container by means of a vertical gradient freezing method;
   c) mounting a tube with an optical window at one end thereof in the crystal growth container so that the optical window is immersed in the melt;
   d) propagating an incident optical signal through the optical window immersed in the melt toward a phase interface between the melt and the crystal;
   e) measuring a reflected optical signal produced by reflection of the incident optical signal from the phase interface in order to determine an actual position or height of said phase interface in relation to said tube with said optical window during said growing of said crystal; and
   f) controlling said growing of said crystal according to said actual position or said height of said phase interface.

2. The method as defined in claim 1, wherein said measuring of said reflected optical signal comprises triangulation with a confocal lens or optics system.

3. The method as defined in claim 1, wherein said measuring of said reflected optical signal comprises interferometric adjustment or balance.

4. The method as defined in claim 1, wherein said optical signal comprises an optical pulse produced by a pulsed laser and said optical pulse is sufficiently short so that an optical signal transit time of said optical pulse to and from said phase interface can be measured and said actual position or height can be determined from said optical signal transit time.

5. The method as defined in claim 1, wherein said optical signal comprises an optical pulse produced by a pulsed laser and said measuring of said reflected optical signal comprises measuring a phase shift of said reflected optical signal so that said position or height is determined from said phase shift.

6. The method as defined in claim 1, wherein said optical window and said tube are arranged so that the optical window is tilted relative to an optic axis of optics for said reflected optical signal.

7. The method as defined in claim 1, wherein said crystal is a calcium fluoride crystal.

8. The method as defined in claim 1, wherein said optical window comprises at least one member selected from the group consisting of silicon carbide, diamond and a diamond-like carbon coated material.

9. The method as defined in claim 1, wherein said optical window consists of single crystal material.

10. A method for measuring a position of a phase interface between a melt and a crystal growing from said melt, said method comprising the steps of:
    a) growing the crystal from said melt by means of a vertical gradient freezing method;
    b) arranging a tube with an optical window at one end thereof, so that the optical window is immersed in said melt;
    c) propagating an incident optical signal through said optical window toward said phase interface between said melt and said crystal; and
    d) measuring a reflected optical signal formed at said phase interface from the incident optical signal and passing through said optical window, in order to determine said position of said phase interface.

11. The method as defined in claim 10, wherein said optical window and said tube are arranged so that the optical window is tilted relative to an optic axis, and said optic axis is perpendicular to the phase interface.

12. A method for measuring a position of a phase interface between a melt and a calcium fluoride crystal growing from said melt, said method comprising:
    a) propagating an incident optical signal toward said phase interface between said melt and said calcium fluoride crystal; and
    b) measuring a reflected optical signal formed at said phase interface from the incident optical signal in order to determine said position of said phase interface.

13. A method for measuring a position of a phase interface between a melt and a crystal growing from said melt, said method comprising the steps of:
    a) growing the crystal from said melt by means of a vertical gradient freezing method;
    b) arranging a tube with an optical window at one end thereof, so that the optical window is immersed in said melt;
    c) propagating an incident optical signal through said optical window toward said phase interface between said melt and said crystal; and
    d) measuring a reflected optical signal formed at said phase interface from the incident optical signal and passing through said optical window, in order to determine said position of said phase interface;
    wherein said optical window comprises at least one member selected from the group consisting of silicon carbide, diamond and a diamond-like carbon coating.

14. The method as defined in claim 13, wherein said optical window consists of single crystal material.

15. A method for measuring a position of a phase interface between a melt and a crystal growing from said melt, said method comprising the steps of:
    a) arranging an optical window in the vicinity of the czystal growing from said melt;
    b) propagating an incident optical signal through said optical window toward said phase interface between said melt and said crystal so that said incident optical signal passes through said crystal to said phase interface; and
    c) measuring a reflected optical signal formed at said phase interface from the incident optical signal and passing through said optical window, in order to determine said position of said phase interface.

16. The method as defined in claim 12, 13, or 15, wherein said measuring of said position of said phase interface takes place by means of triangulation with a confocal lens or optics system.

17. The method as defined in claim 12, 13, or 15, wherein said measuring of said position of said phase interface takes place by interferometric adjustment or balance.

18. The method as defined in claim 12, 13 or 15, wherein said measuring of said position of said phase interface takes place by measuring optical signal transit time.

* * * * *

UNITED STATES PATENT AND TRADEMARK OFFICE
CERTIFICATE OF CORRECTION

PATENT NO. : 6,932,864 B2  Page 1 of 1
APPLICATION NO. : 10/128856
DATED : August 23, 2005
INVENTOR(S) : Lutz Parthier et al.

It is certified that error appears in the above-identified patent and that said Letters Patent is hereby corrected as shown below:

AT SECTION 73 ASSIGNEE, DELETE "SCHOTT GLAS" AND SUBSTITUTE --SCHOTT AG--

Signed and Sealed this

Twenty-first Day of August, 2007

JON W. DUDAS
*Director of the United States Patent and Trademark Office*